United States Patent
De Los Santos

(10) Patent No.: US 8,509,584 B2
(45) Date of Patent: Aug. 13, 2013

(54) NANO-ELECTRON FLUIDIC LOGIC (NFL) DEVICE

(76) Inventor: Hector J. De Los Santos, Irvine, CA (US)

(*) Notice: Subject to any disclaimer, the term of this patent is extended or adjusted under 35 U.S.C. 154(b) by 882 days.

(21) Appl. No.: 12/432,555

(22) Filed: Apr. 29, 2009

(65) Prior Publication Data

US 2009/0267646 A1    Oct. 29, 2009

Related U.S. Application Data

(60) Provisional application No. 61/125,987, filed on Apr. 29, 2008.

(51) Int. Cl.
*G02B 6/10* (2006.01)
*G02B 6/35* (2006.01)

(52) U.S. Cl.
USPC .............. 385/130; 385/16; 977/936; 977/940

(58) Field of Classification Search
USPC .................................................. 977/936, 940
See application file for complete search history.

(56) References Cited

U.S. PATENT DOCUMENTS 6,178,275 B1 * 1/2001 Nerses et al. .................... 385/14
7,379,634 B2 * 5/2008 Hyde et al. ....................... 385/16

OTHER PUBLICATIONS

Krasavin, A.V.; Zayats, A.V.; Zheludev, N.I.; "Active Control of Surface Plasmon-Polariton Waves"; Journal of Optics A: Pure and Applied Optics; Bearing dates of Jun. 1, 2004, Oct. 19, 2004, Jan. 20, 2005; pp. S85-S89; vol. 7; IOP Publishing Ltd.*

* cited by examiner

*Primary Examiner* — Omar Rojas
(74) *Attorney, Agent, or Firm* — John Alumit

(57) ABSTRACT

A nano-electron fluidic logic (NFL) device for controlling launching and propagation of at least one surface plasma wave (SPW) is disclosed. The NFL device comprises a metallic gate patterned with a plurality of terminals at which SPWs may be launched and a plurality of drain terminals a which the SPWs may be detected. A wave guiding structure such as a 2 DEG EF facilitates propagation of the SPW within the structure so as to scatter/steer the SPW in a direction different from a pre-scattering direction. A bias SPW is excited by an application of a control SPW with a momentum vector at an angle to the bias SPW and a control current with a wavevector which scatters the bias SPW in the direction of at least one output SPW, towards a drain terminal. The NFL device is rendered with device speed as a function of SPW propagation velocity.

25 Claims, 10 Drawing Sheets

| Truth Table |||||||
|---|---|---|---|---|---|---|
| Present State |||| | Next State ||
| $C_1$ | $C_2$ | $O_1$ | $O_2$ | | $O_1$ | $O_2$ |
| 0 | 0 | 0 | 1 | | 0 | 1 |
| 0 | 0 | 1 | 0 | | 1 | 0 |
| 0 | 1 | 0 | 1 | | 1 | 0 |
| 0 | 1 | 1 | 0 | | 1 | 0 |
| 1 | 0 | 0 | 1 | | 0 | 1 |
| 1 | 0 | 1 | 0 | | 0 | 1 |

NANO-ELECTRON FLUIDIC LOGIC (NFL) DEVICE

CROSS-REFERENCE TO RELATED APPLICATION

This application claims the benefit of the provisional patent application No. 61/125,987 filed on Apr. 29, 2008

FEDERALLY SPONSORED RESEARCH

Not Applicable

SEQUENCE LISTING OR PROGRAM

Not Applicable

STATEMENT REGARDING COPYRIGHTED MATERIAL

Portions of the disclosure of this patent document contain material that is subject to copyright protection. The copyright owner has no objection to the facsimile reproduction by anyone of the patent document or the patent disclosure as it appears in the Patent and Trademark Office file or records, but otherwise reserves all copyright rights whatsoever.

BACKGROUND

The invention relates in general to digital logic circuits fabricated as integrated circuits, and more particularly to a nano-electron fluidic logic (NFL) device that operates by steering the propagation direction of a surface plasma wave (SPW) set up in an electron fluid (EF), with device speed as a function of SPW propagation velocity.

Advanced digital circuits for logic and digital applications fabricated with CMOS integrated technology become a dominant technology in semiconductor industry. The continuous improvement in the basic CMOS integrated devices is attributed to scaling of the device's dimensions for enhancing speed. Without a commensurate increase in operating speed, the point of diminishing returns for CMOS scaling is imminent. Accordingly, new device concepts and technologies that may shift CMOS scaling necessitates another paradigm effectively utilizing manipulation of plasmons in a channel cavity.

Surface plasmons may exist on a boundary between two materials when the real parts of dielectric constants have different signs, for example, between a metal and a dielectric. The material or structure forming the boundary with the material may be air, vacuum, or its equivalent, a substantially homogeneous dielectric material, or a different material or structure. The boundary, although being substantially continuous and planar, may have different shapes. The plasmon, although including substantially exponential functions with a field maximum at the boundary, may include only approximately exponential functions, may be described by a different function, and/or may have a field maximum some place other than the boundary.

Several optical waveguiding structures with the utilization of plasmon propagation have been developed in the art. For example, U.S. Pat. No. 6,977,767 issued to Sarychev discloses a method for controlling, guiding, manipulating, and circuiting light, and performing surface-enhanced spectroscopy in medium comprising plasmonic nanomaterials via the excitation of plasmon modes in the materials. The plasmonic nanomaterials are based on metal films with or without arrays of nanoholes and/or on metal nanowires and/or spheroids. There are also devices and methods employing such plasmonic nanomaterials. A device operating according to the method may comprise integrated optical elements to control light at telecommunications wavelengths between approximately 1.3 microns to 1.6 microns. A device operating according to the method may comprise one or more photonic chips comprising one or more photonic circuits.

U.S. Pat. No. 7,447,392 issued to Hyde discloses a plasmon gate and a method of controlling energy propagation comprising guiding energy at a first plasmon frequency along a first path, blocking the guided energy at the first plasmon frequency from propagating along the first path responsive to a first signal at a first time, blocking the guided energy at the first plasmon frequency from propagating along the first path responsive to a second signal, different from the first signal, at a second time, and receiving an output that is a function of the first signal and the second signal.

There are many advanced digital circuits fabricated in CMOS technology which uses FET transistors for yielding high speed and low power consumption. For example, U.S. Pat. No. 5,001,367 issued to Vinal explains a CMOS logic circuit that includes a driving stage having a plurality of parallel FETs of a first conductivity type for receiving logic input signals and a load FET of second conductivity type connected to a common output of the driving stage. A complementary FET inverter including serially connected FETs of the first and second conductivity type is connected to the common output and the load FET. According to the invention, the voltage transfer function of the complementary inverter is skewed so that the product of the carrier mobility and the ratio of channel width to length of the inverter FET of the first conductivity type is made substantially greater than the product of the carrier mobility and the ratio of channel width to the length of the inverter FET of the second conductivity type. By skewing the voltage transfer function of the complementary inverter the voltage lift-off interval is dramatically decreased, thereby improving the speed. A multigate serial load transistor further reduces power consumption.

Hence it can be seen that the conventional MOS structures are limited in various ways like increase in power consumption due to increased leakage currents, short channel effects, source-drain tunneling, pn junction tunneling, decrease in channel mobility, increase in the interconnection resistance concomitant with the smaller process geometries, and the like. Advancements in submicron CMOS processing greatly benefit digital logic and memory, but result in poor analog and RF performance and a high level of complexity in both lithography and design resulting in high manufacturing cost.

Although the above inventions serve a similar purpose, the object of the present invention is to provide a NFL device that operates by steering the propagation direction of a SPW set up in an electron fluid. A further object of the present invention is to provide a NFL device with device speed as a function of SPW propagation velocity. Other objects of the present invention will become better understood with reference to the appended Summary, Description, and Claims.

SUMMARY

The present invention is a nano-electron fluidic logic (NFL) device for launching and controlling propagation of at least one surface plasma wave (SPW). The NFL device comprises a metallic gate patterned in accordance with a plurality of geometrical parameters, a plurality of source terminals at which a plurality of SPWs is launched and a plurality of drain terminals at which the plurality of SPWs is detected. The plurality of geometrical parameters associated with the patterned metallic gate includes width of at least one N-doped region, a source-drain channel length (L), and an angle (θ). The NFL device is fabricated as a metal-oxide-semiconductor (MOS) structure.

A wave guiding structure such as the 2 Dimensional Electron Gas, behaving as an Electron Fluid (2 DEG EF), a Luttinger liquid, or the like, facilitates propagation of the SPW within the structure so as to scatter/steer the SPW in a direction different from a pre-scattering direction. The 2DEG EF steers the SPW with velocity about two orders of magnitude greater than that of electrons propagated thereby, resulting in plasmons. While inducing the 2DEG EF under the patterned metallic gate, a bias SPW is launched into the source bias terminal ($S_{Bias}$) and a control SPW at an angle to the bias SPW is launched into the at least one source control terminals ($S_{c1}$, $S_{c2}$). The bias SPW with a momentum vector ($\vec{K}_{Bias}$) is excited by a bias current ($I_{Bias}$) to attain a momentum vector ($\vec{K}_{Bias}$). The control SPW with at least one momentum vector ($\vec{K}_{C1}$, $\vec{K}_{C2}$) is excited by at least one control current ($I_{C1}$, $I_{C2}$) causes scattering of the bias SPW with the momentum vector ($\vec{K}_{Bias}$) in the direction of at least one out but SPW with at least one momentum vector ($\vec{K}_{O1}$, $\vec{K}_{O2}$), substantially towards the at least one drain terminal ($D_{O1}$, $D_{O2}$).

Presence of at least one output SPW with the at least one momentum vector ($\vec{K}_{O1}$, $\vec{K}_{O2}$) at the at least one drain terminal ($D_{O1}$, $D_{O2}$) is detected as a logic 1 and absence of the at least one output SPW with the at least one momentum vector ($\vec{K}_{O1}$, $\vec{K}_{O2}$) at the at least one drain terminal ($D_{O1}$, $D_{O2}$) is detected as a logic 0. By controlling the launching of SPWs, according to a truth table, a flip-flop logic function may be realized.

Particularly, there are two modes of operation for the NFL device through a sequence of events leading to the launching of the SPWs. In the first mode of operation, prior to launching the bias and control SPWs, the 2DEG EF is created under the patterned gate by application of the proper gate voltage, resulting in a bias state, namely, a charge sheet equilibrium (neutral) standby state that can support the propagation of SPWs, prior to the beginning of any logic operation. The speeds are dictated by the displacement of equilibrium electron density, relative to the positive background charge, and the SPW propagation velocity. The speed of the at least one SPW generation, calculated as displacement of the at least one SPW in at least one direction is $\tau_{SPW\_Displacement}=\pi/\omega_0$. The smallest switching time may for the at least one SPW is approximately given by $\tau_{SPW\_Displacement}+L/S_{SPW}$.

To ensure the adequate longevity of the SPW, its velocity must exceed a certain threshold velocity, $v_{Th}$, determined by both scattering and viscosity, and captured by an effective mean time between collisions, τ. If the propagation lengths of SPWs are sufficiently long, SPWs may be employed for signal processing functions, the only energy required being that to launch them. The corresponding plasmon propagation velocity is given, where $s_{2D}=\sqrt{e^2 n_s d/m^* \epsilon_r \epsilon_0}$ $\epsilon_0=8.854\times 10^{-12}$ $A^2 s^4 kg^{-1} m^{-3}$, $\epsilon_r=12.9$, the relative dielectric constant of a semiconductor, $m^*=0.067 m_0$, the electron effective mass, $n_s=1\times 10^{16}$ $m^{-2}$, the free carrier density, and d=3 nm, the gate-channel separation. Thus, the SPW may propagate a distance of 140 nm in 2.7 fs. In the presence of drain current, the SPW dispersion relation is given by $k=\omega/(v_0 \pm s_{SPW})$, where k is the wavevector, $v_0$ is the electron velocity, and $s_{SPW}$ is the SPW velocity. The plus sign pertains to propagation of the at least one SPW along the direction of the current and the minus sign to propagation of the at least one SPW in an opposite direction of the current.

The plasmon velocity in the direction of current flow is increased, and in the opposite direction, it is reduced. Setting up a drain current facilitates achieving the condition for extending the propagation length of the SPW, and favoring the direction of current flow as the direction of propagation. A bias drain current with any nonzero value is sufficient to extend the propagation length.

In the second mode of operation, the 2DEG EF is set up dynamically prior to launching the bias and control SPWs. The device speed may be controlled by the parasitic effects and time constants associated with charging the NFL gate capacitance. The preferred mode of NFL logic is self-timed for operation. In these modes of operations, the NFL circuit may facilitate the SPWs to be launched by a light-plasmon coupling. In addition, the integration of devices results in the formation of the NFL array, of which the arrangements may be utilized for parallel data processing.

Two SPWs with momentum vectors $\vec{p}_{Bias}$, $\vec{p}_{C2}$ and masses (energies) $m_{Bias}$, $M_{C2}$ respectively are excited/launched into terminals $S_{Bias}$ and $S_{C2}$, of the geometrical parameters of the prototypical implementation, and propagating on the 2DEG EF, upon interacting/colliding at the junction/center of the structure, the SPW with momentum $\vec{p}_{Bias}$ may be scattered (diverted/steered) by the SPW with momentum $\vec{p}_{C2}$ in the direction of output SPW $\vec{p}_{O1}$. The probability that the SPW with momentum vector $\vec{k}_{Bias}$ upon exposure to the SPW with momentum vector $\vec{k}_{C2}$ to divert by a solid angle (θ, φ) is given by dσ(θ, φ) as $$d\sigma_{2\leftarrow 2} = \frac{1}{4\sqrt{(p_{Bias}\cdot P_{C2})^2 - m_{Bias}^2 m_{C2}^2}} \int_\Delta \frac{d^3 p_{\vec{k}_{O1}}}{2p_{\vec{k}_{O1}}^0 (2\pi)^3} \frac{d^3 p_{\vec{k}_{O2}}}{2p_{\vec{k}_{O2}}^0 (2\pi)^3}$$
$$\left(p_{\vec{k}_{O1}}, p_{k_{O2}} |\mathcal{T}| p_{Bias}, p_{C2}\right)^2 (2\pi)^4 \delta^{(4)}\left(p_{Bias} + p_{C2} - p_{\vec{k}_{O1}} - p_{\vec{k}_{O2}}\right)$$

where, $p_{Bias}$ is the SPW with momentum vector $\vec{k}_{Bias}$, $p_{C2}$ is the control SPW with momentum vector $\vec{k}_{C2}$, $p_{\vec{k}_{O2}}$ is the SPW in the direction of $\vec{k}_{O2}$, $p_{\vec{k}_{O1}}$ is the SPW in the direction of $\vec{k}_{O1}$, $\mathcal{T}$ is the plasmon-plasmon scattering amplitude, and Δ is the area/shell over which integration is performed.

Although particular embodiments of the present invention have been described in the foregoing description, it is to be understood that the present invention is not to be limited to just the embodiments disclosed, but that they are capable of numerous rearrangements, modifications and substitutions without departing from the description herein.

REFERENCE NUMERALS

Figure 1:
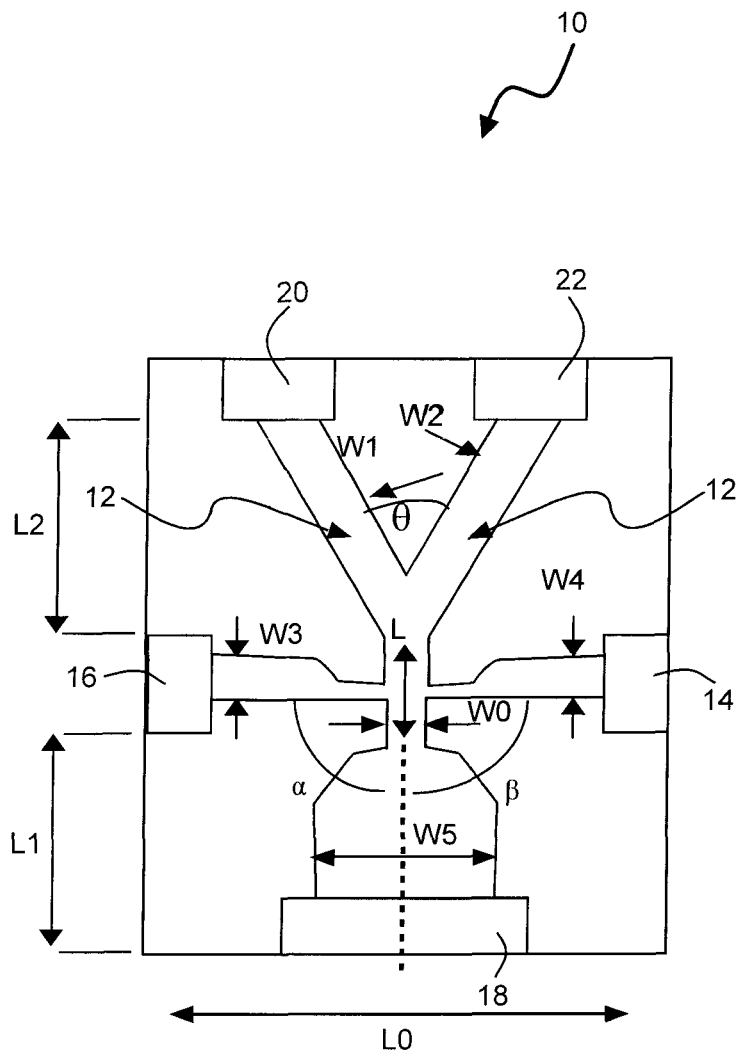
FIG. 1 is a top plan view of a nano-electron fluidic logic (NFL) device for controlling active manipulation of at least one surface plasma wave (SPW) according to the present invention.

10 . . . a nano-electron fluidic logic (NFL) device
12 . . . metallic gate
14, 16, 18 . . . a plurality of source terminals
20, 22 . . . a plurality of drain terminals
30 . . . pattern of momentum vectors
40 . . . flip-flop truth table
50 . . . operational flow chart for launching and propagating an SPW
52 . . . creation of a 2DEG fluid
54 . . . launching of a bias SPW
56 . . . launching of a control SPW
58 . . . scattering and propagation of the bias SPW
60 . . . detection of output SPW
70 . . . NFL circuit with SPW propagation gated by gate-source voltage of subsequent gates
80 . . . NFL circuit with SPW propagation enhanced by bias currents
90 . . . NFL circuit with SPWs launched by light-plasmon coupling
100 . . . NFL array configuration for parallel data processing
110 . . . cross sectional view of semiconductor wafer taken about the region of drain terminals
112 . . . semiconductor wafer
114 . . . n-type doping region
116 . . . metallic gate
118 . . . insulating layer
120 . . . cross sectional view of semiconductor wafer taken about the region of source terminals
130,140 . . . cross sectional views of semiconductor wafer taken about the regions of source terminals
150 . . . dominant Feynman diagrams for plasmon-plasmon scattering strength
160 . . . interaction between plasmons in a bubble contribution
170 . . . interaction between plasmons in a triangle contribution
180 . . . interaction between plasmons in a square contribution
190 . . . graphical representation of plasmon-plasmon scattering strength

DETAILED DESCRIPTION

Referring to the drawings, a preferred embodiment of a device for controlling launching and propagation of at least one surface plasma wave (SPW) in a nano-electron fluidic logic (NFL) operation is illustrated and generally indicated as 10 in FIGS. 1 through 8.

Referring to FIG. 1, a top plan view of a NFL device 10 for controlling active manipulation of the at least one SPW is illustrated. The NFL device 10 comprises a metallic gate 12 patterned in accordance with a plurality of geometrical parameters, i.e., a plurality of source terminals ($S_{Bias}$, $S_{C1}$, $S_{C2}$) 14, 16, 18 at which a plurality of SPWs is launched and a plurality of drain terminals ($D_{O1}$, $D_{C2}$) 20, 22 at which the plurality of SPWs is detected. The manipulation of the at least one SPW at the source terminal 18 may be regulated by way of at least one control SPW applied to the at least one source terminal 14, 16. The plurality of geometrical parameters associated with the patterned metallic gate 12 may include width of at least one N-doped region indicated as W0, W1, W2, W3, W4, W5, at a plurality of source and drain terminals to serve as the source of a bias current, a drain current and a control current, a source-drain channel length (L), and an angle (θ). The widths of the at least one N-doped region is at least equal to or greater that of the patterned metallic gate 12 next to them, i.e., W1, W2, W3, W4, and W5 respectively. The NFL device 10 is fabricated as a metal-oxide-semiconductor (MOS) structure, where the patterned metallic gate 12 has thickness Tm, an oxide insulating layer of thickness Ti, and doping of the semiconductor underneath of thickness Td. The NFL device allows the launching of a bias SPW and a control SPW at an angle to the bias SPW into the waveguiding structure, the NFL device operates by steering the propagation direction of the bias SPW resulting in the NFL device speed which depends on a propagation velocity of the at least one SPW and yields femto-seconds switching speeds at femto-joules power dissipation. Typically, a waveguiding structure such as the 2DEG EF, a Luttinger liquid or the like facilitates propagation of the SPW so as to scatter/steer the SPW in a direction different from a pre-scattering direction.

Referring to FIGS. 2A through 2D, a qualitative SPW manipulation and propagation on a 2 Dimensional Electron Gas (2DEG) that behaves as an Electron Fluid (EF) and a subsequent realization truth table 40 of a logic flip-flop (FF) (not shown). The 2DEG EF steers the SPW with velocity about two orders of magnitude greater than that of electrons propagated thereby resulting in plasmons. While inducing the 2DEG EF under the patterned metallic gate 12, the bias SPW is launched into the source bias terminal ($S_{Bias}$) 18 and the control SPW is launched into the at least one source control terminals ($S_{c1}$, $S_{c2}$). The bias SPW with the momentum vector ($\vec{k}_{Bias}$) is excited by the bias current ($I_{Bias}$) to attain a momentum vector ($\vec{k}_{Bias}$). The control SPW with at least one momentum vector ($\vec{k}_{C1}$, $\vec{k}_{C2}$) is excited by at least one control current ($I_{C1}$, $I_{C2}$) causes the scattering of the bias SPW with the momentum vector ($\vec{k}_{Bias}$) in the direction of at least one output SPW with at least one momentum vector ($\vec{k}_{O1}$, $\vec{k}_{O2}$), substantially towards the at least one drain terminal ($D_{O1}$, $D_{O2}$) 20, 22.

Figure 2A:
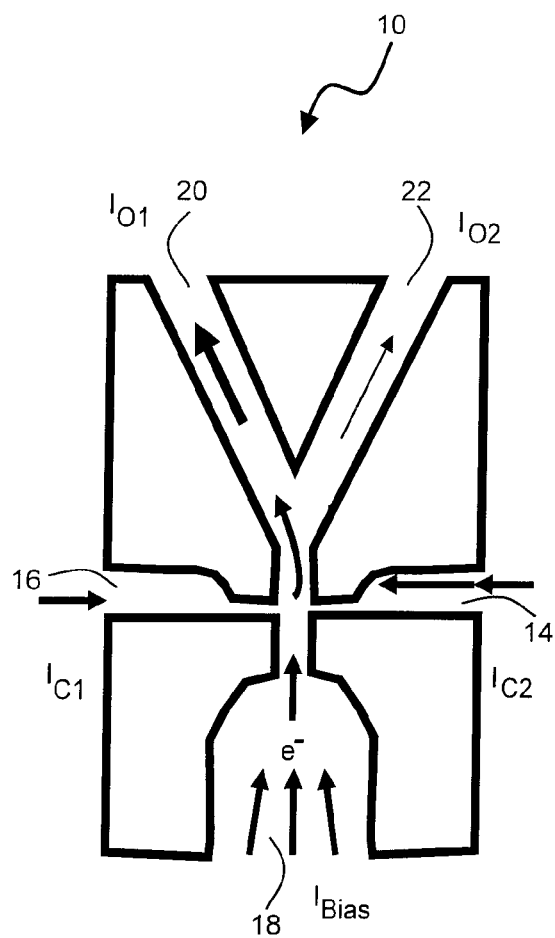
FIGS. 2A through 2D illustrate a qualitative manipulation and propagation of the at least one SPW on a 2 Dimensional Electron Gas (2DEG) and a subsequent realization truth table of a logic flip-flop.
Figure 2B:
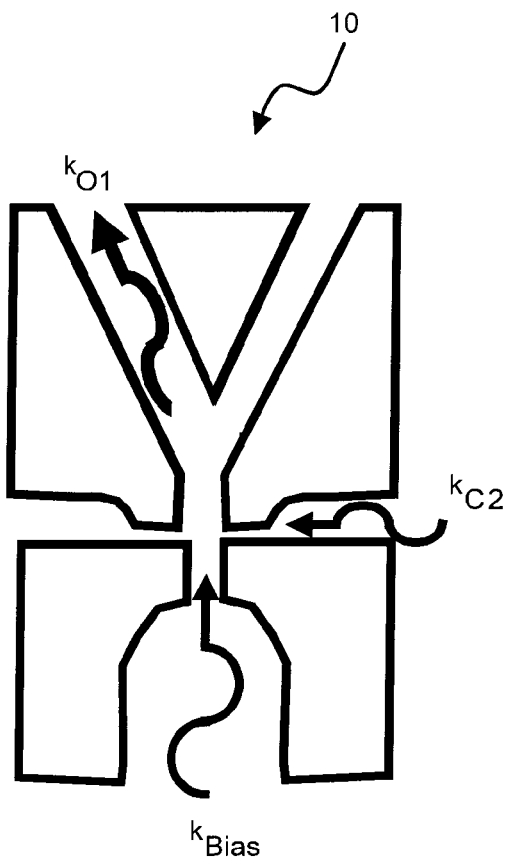
Figures 2C, 2D:
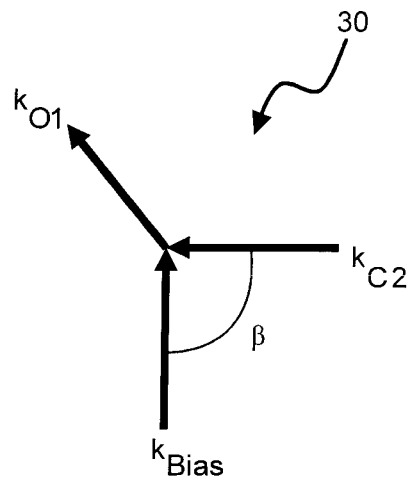

With reference to FIG. 2A, the NFL device 10 illustrates the 2DEG EF and the bias current ($I_{Bias}$) and the control current ($I_{C2}$) passing therethrough. In the absence of the control SPW, which could otherwise be launched from either the source C1 ($S_{C1}$) or source C2 ($S_{C2}$) terminals, the bias SPW would be split substantially into equal portions that is detected at the at least one drain terminal ($D_{O1}$, $D_{O2}$) 20, 22. FIG. 2B illustrates bias and control SPWs with the momentum vectors $\vec{k}_{Bias}$ and $\vec{k}_{C2}$ excited and launched into the source bias and source control terminals $S_{Bias}$ and $S_{C2}$ and propagate on the 2DEG EF. Upon reaching the junction, in the center of the structure 10 the bias SPW with the momentum vector $\vec{k}_{Bias}$ is scattered/steered by the control SPW with the momentum vector $\vec{k}_{C2}$ in the direction of output SPW with the momentum vector $\vec{k}_{O1}$ that exits through the drain terminal ($D_{O1}$) 20. FIG. 2C illustrates a pattern of momentum vector 30 in which the control SPW with the momentum vector $\vec{k}_{C2}$ diverts the bias SPW in direction of output SPW with the momentum vector $\vec{k}_{O1}$. The presence of the output SPW with the momentum vector $\vec{k}_{O1}$ at the drain terminal ($D_{O1}$) 20 is detected as a logic 1. The absence of the output SPW with the momentum vector $\vec{k}_{O1}$ at the drain terminal ($D_{O1}$) 20 is detected as a logic 0. As shown in FIG. 2C, conservation of SPW momentum determines the output SPW with the momentum vector $\vec{k}_{O1}$. By controlling the launching of the SPWs, according to a truth table 40 shown in FIG. 2D, the flip-flop logic function may be realized.

Figure 3:
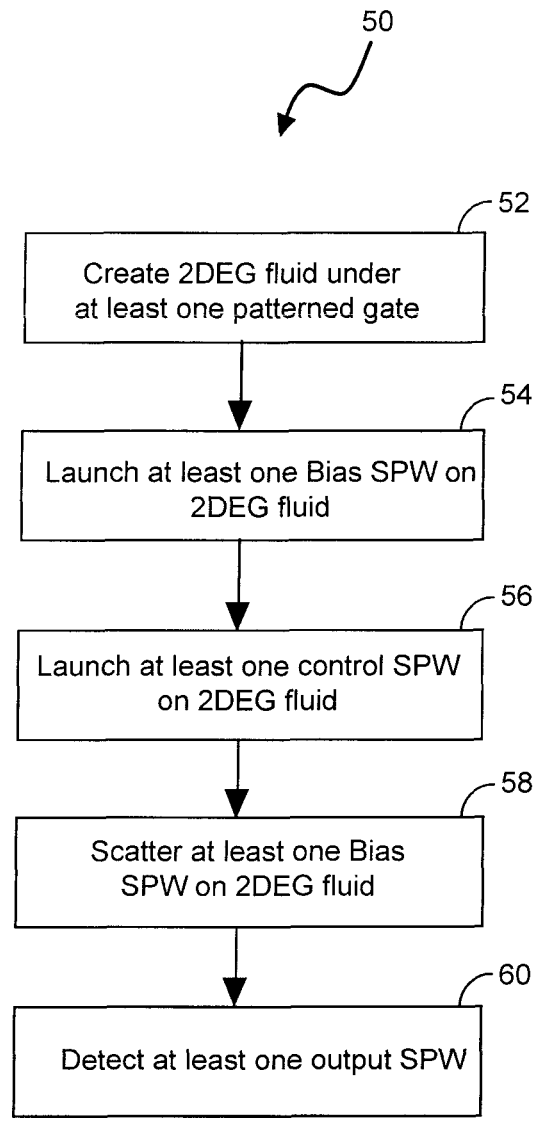
FIG. 3 is an operational flow chart illustrating launching and propagation of the at least one surface plasma wave (SPW) in a nano-electron fluidic logic (NFL) operation.

FIG. 3 is an operational flow chart 50 illustrating the launching and propagation of at least one surface plasma wave (SPW) in a nano-electron fluidic (NFL) operation. A patterned two-dimensional electron gas (2DEG) that behaves as an electron fluid is created underneath at least one patterned metallic gate as indicated at block 52. At block 54, the at least one bias SPW is launched on the 2DEG fluid. At block 56, at least one control SPW at an angle to the at least one bias SPW is launched on the 2DEG. The at least one bias SPW is scattered to propagate on the 2DEG fluid as indicated at block 58. At block 60, at least one output SPW is detected in the direction of at least one drain terminal ($D_{O1}$, $D_{O2}$) 20, 22.

Referring to FIGS. 4A through 4D, an examination of the principles of operation of NFL, in light of circuits and systems considerations is illustrated which elicit the ultimate device density, the ultimate device speed, integration of many devices resulting in formation of an NFL array that eliminates cross talk, forming interconnections between gates, interfacing NFL to conventional electronics and clocking of these devices via opto-electronic techniques.

Figure 4A:
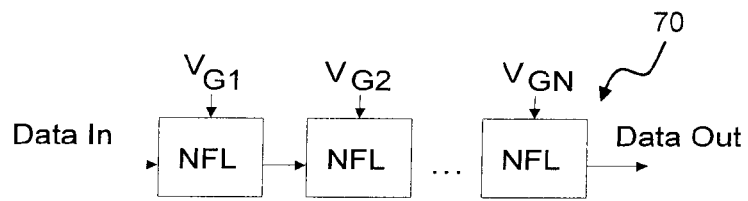
FIG. 4A is a nano-electron fluidic logic (NFL) circuit wherein propagation of the at least one surface plasma wave (SPW) is gated by gate-source voltages of at least one subsequent patterned gate.
Figure 4B:
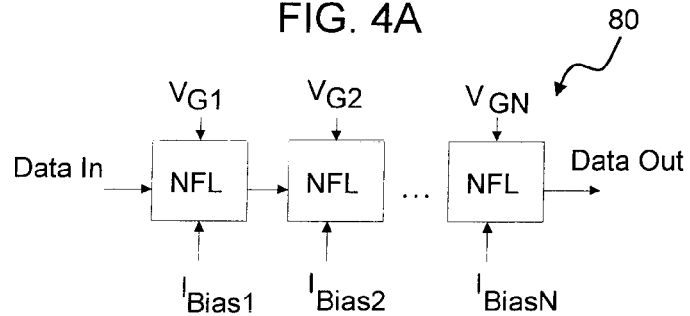
FIG. 4B is a nano-electron fluidic logic (NFL) circuit wherein propagation of the at least one surface plasma wave (SPW) is enhanced by bias current.
Figure 4C:
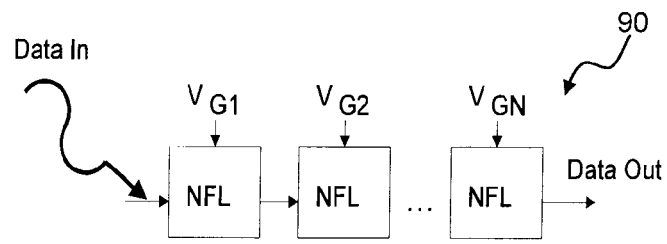
FIG. 4C is a nano-electron fluidic logic (NFL) circuit wherein the at least one surface plasma wave (SPW) is launched by light-plasmon coupling.
Figure 4D:
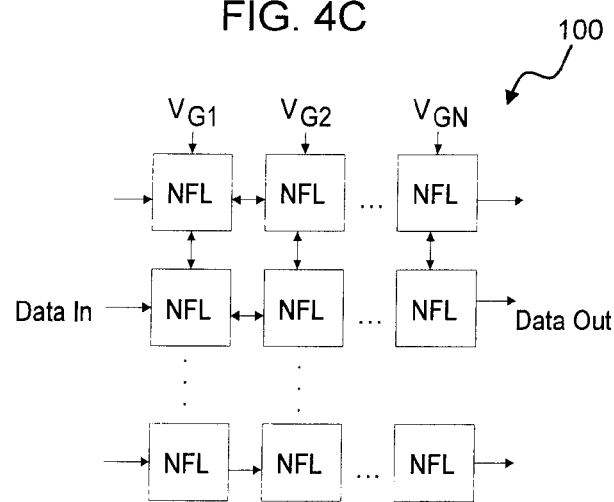
FIG. 4D is a nano-electron fluidic logic (NFL) array wherein arrangements illustrated in FIGS. 4A through 4C may be utilized for parallel data processing.

FIG. 4A is a NFL circuit 70 wherein propagation of at least one SPW is gated by gate-source voltages of at least one subsequent patterned gate 12. FIG. 4B illustrates a NFL circuit 80 wherein propagation of at least one SPW is enhanced by bias current. FIG. 4C illustrates a NFL circuit 90 wherein at least one SPW is launched by light-plasmon coupling. FIG. 4D is a NFL array 100 wherein arrangements illustrated in FIGS. 4A through 4C may be utilized for parallel data processing.

Typically, SPW reflection within the channel (source-drain) cavity needs to be avoided in predetermined operating conditions. Therefore, the device density limits by that at which a resonance may occur. As the resonance frequency is $\omega_0 = \pi s_{SPW}/2L$, a trade-off exists between operating frequency and channel length and device density. The ultimate device density is that of the smallest possible plasmon. Therefore, the ultimate density, which suggests a greater equivalent density, may be equal to the areal atomic density of the material utilized.

Particularly there are two modes of operation for the NFL device 10 through a sequence of events leading to launching the SPWs. In the first mode of operation, prior to launching the bias and control SPWs, the 2DEG EF is created under the patterned metallic gate 12 by the application of the proper gate voltage such as $V_{G1}, V_{G2}, \ldots V_{GN}$. This results in a bias state, namely, a charge sheet equilibrium (neutral) standby state that can support the propagation of SPWs, prior to the beginning of any logic operation. This state may be set at, e.g., the power up of the system, and the speed of any subsequent logic operation can be determined by the speeds at which the SPWs may be generated and propagated. These speeds are dictated by the displacement of equilibrium electron density, relative to the positive background charge, and the SPW propagation velocity.

The speed of the at least one SPW generation calculated as displacement of the at least one SPW in at least one direction is given by $\tau_{SPW\_Displacement} = \pi/\omega_0$, where $\omega_0$ is the plasma oscillation frequency. The smallest switching time may be approximately given by $\tau_{SPW\_Displacement} + L/S_{SPW}$, where L is the source-drain distance; and $s_{SPW}$ is the SPW velocity. The presence of a bias source-drain potential difference, which can be set up prior to any logic operation, if desired, establishes a baseline drift velocity $v_0$ that may extend the life/propagation distance of the "bias" and "control" SPWs.

In the absence of at least one drain current, ($I_{O1}$, $I_{O2}$) produced in the at least one drain terminal ($D_{O1}$, $D_{O2}$), application of a large gate-source bias, $U_0$ disturbs the high-density charge sheet equilibrium and results in the creation of the SPW with linear dispersion, which propagates with a wave velocity $S_L = \sqrt{eU_0/m^*}$. Thus, the high-density carrier sheet acts as an SPW waveguide structure. The maximum length of propagation, however, is limited by two main decay mechanisms, namely, electron scattering by phonons or impurities, captured by the momentum relaxation time, $\tau_p$, and the viscosity of the electron fluid, $v = v_F \lambda_{ee}$ where, $v_F$ is the Fermi velocity and $\lambda_{ee}$ is the average distance between electrons. The viscosity gives rise to a damping time constant $\tau_v = vk^2$. The ability of an SPW of velocity $v_{SPW}$ to propagate a distance L, then, depends on whether the conditions $L/v_{SPW} < \frac{1}{2}\tau_p$ and $L/v_{SPW} < \tau_v$ are satisfied. To ensure the adequate longevity of the SPW, its velocity must exceed a certain threshold velocity, $v_{Th}$, determined by both scattering and viscosity, and captured by an effective mean time between collisions, $\tau$. If the propagation lengths of the SPWs are sufficiently long, the SPWs may be employed for signal processing functions, the only energy required being that to launch them.

The plasma oscillations may be visualized as resulting from the motion of electron density in the 2 DEG, of total mass m, with respect to the positive background charge and its motion under the electrostatic restoring force that allows to estimate the maximum stored energy as, $E_s = m v_{sat}^2/2$, where $v_{sat}$ is the saturation velocity of electrons. The energy spent in setting the plasmon into motion is given by $E_d = E_s/Q$, where Q is the quality factor of the system. As with any other oscillating system, the Q of the 2DEG is given by $Q = \omega_0/2\alpha = \omega_0 R_{2DEG}/2L_{2DEG}$, where $\omega_0$ is the plasma frequency, $\alpha$ is the damping constant and $R_{2DEG}=m^*/ne^2A\tau$ and $L_{2DEG}=m^*/ne^2A$ are the 2DEG resistance and kinetic inductance respectively. Thus, the energy dissipated to launch the at least one plasmon in the 2DEG fluid is given by $E_d=mv_{sat}^2/2\omega_0\tau$ where $\omega_0$ is the plasma oscillation frequency, and $\tau$, the effective mean time between collisions.

For a gated 2DEG with the gate-source bias, $U_0$, $k\cong\sqrt{2\pi n_s}$. The corresponding plasmon propagation velocity is given by $S_{2D}=\sqrt{e^2n_s d/m^*\in_r\in_0}$ where $\in_0=8.854\times10^{-12}$ $A^2s^4kg^{-1}m^{-3}$, $\in_r=12.9$, the relative dielectric constant of a semiconductor, $m^*=0.067m_0$, the electron effective mass, $n_s=1\times10^{16}$ $m^{-2}$, the free carrier density, and $d=3$ nm, the gate-channel separation. Thus, the SPW may propagate a distance of 140 nm in 2.7 fs. Signal processing functions based on SPWs of long propagation lengths may be an extremely low-power dissipation and high-speed technology. For an ungated 2DEG, with grounded source and open drain, $k=\pi(2l-1)/2L$, where L is the source-drain distance and l is an integer standing for the mode index.

In the presence of the at least one drain current, $(I_{O1}, I_{O2})$ produced in the at least one drain terminal $(D_{O1}, D_{O2})$, the SPW dispersion relation is given by $k=\omega/(v_0\pm s_{SPW})$, where k is the wavevector, $v_0$ is the electron velocity, and $s_{SPW}$ is the SPW velocity. The plus sign pertains to propagation of the at least one SPW along the direction of the current and the minus sign to propagation of the at least one SPW in an opposite direction of the current.

The plasmon velocity in the direction of current flow is increased, and that in the opposite direction is reduced, setting up the drain current which facilitates achieving the condition for extending the propagation length of the SPW, and favoring the direction of current flow as the direction of propagation. Thus, a bias drain current may be necessary in certain SPW propagation applications. If the material quality is such that in the absence of the drain current the plasmons can propagate tens of nm, the impact of bias current on power dissipation is negligible, since in principle any nonzero value of current may be sufficient to extend the propagation length.

In the second mode of operation, the 2DEG EF is set up dynamically prior to launching the bias and control SPWs. The device speed, then, may be controlled by the parasitic effects and time constants associated with charging the NFL gate capacitance. This mode of operation, and the potential speed penalty incurred, however, is justified only whenever it becomes necessary to interface with CMOS logic. The preferred mode of NFL logic is self-timed for operation. In these modes of operations, the NFL circuit may facilitate the SPWs to be launched by a light-plasmon coupling. In addition, the integration of devices results in formation of the NFL array 100, wherein arrangements may be utilized for parallel data processing.

Figure 5:
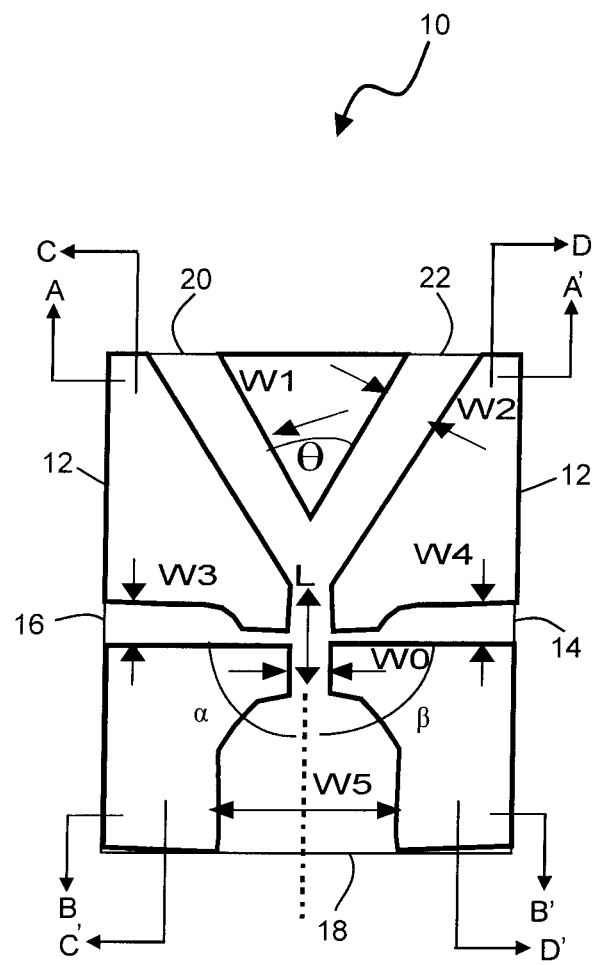
FIG. 5 is a top plan view of a prototypical implementation of a nano-electron fluidic logic (NFL) device of the present invention.
Figure 5A:
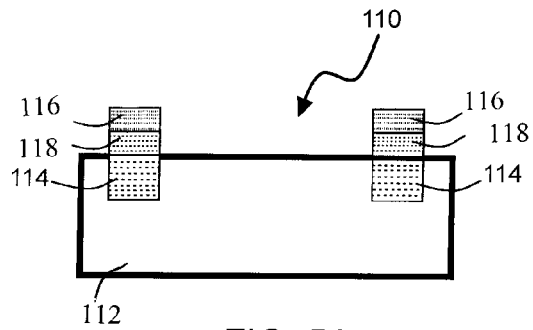
FIG. 5A is a cross sectional view taken along lines A-A' of FIG. 5 of the present invention.
Figure 5B:
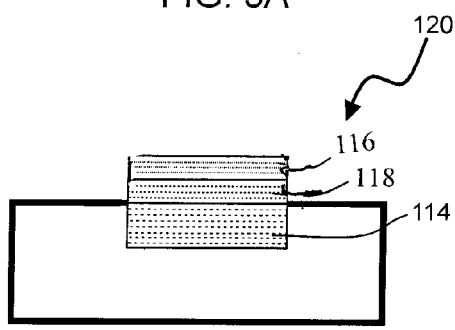
FIG. 5B is a cross sectional view taken along lines B-B' of FIG. 5 of the present invention.
Figure 5C:
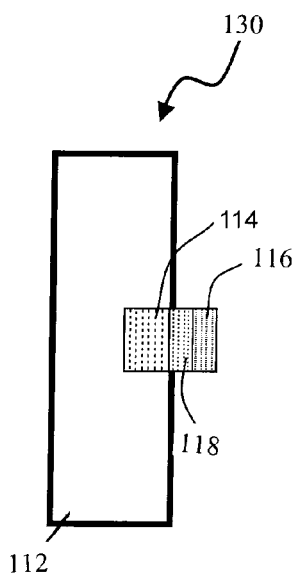
FIG. 5C is a cross sectional view taken along lines C-C' of FIG. 5 of the present invention.
Figure 5D:
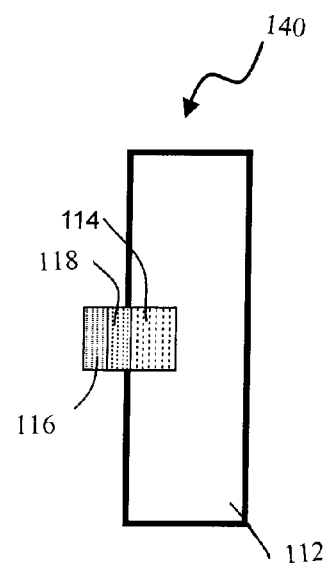
FIG. 5D is a cross sectional view taken along lines D-D' of FIG. 5 of the present invention.

FIG. 5 is a top plan view of a prototypical implementation of the NFL device 10 of the present invention. FIG. 5A through 5D are cross sectional views 110, 120, 130, 140 of FIG. 5 taken along lines A-A', B-B', C-C' and D-D' respectively. The cross sectional configuration includes a semiconductor wafer 112 underneath the structure 10 which is patterned with the N-Type doping (Td, W5) 114, a metal gate (Tm, W5) 116 and an insulating layer (Ti, W5) 118 arranged between the N-doped region 114 and the metal gate 116. The prototypical NFL device 10 with the geometry of FIG. 5, may have the following parameters: 1)1.2 nm gate oxide; 2) 1200 Å $n^+$ poly gate; 3) n-type (MOSFET-like) sources and drains; 4) W1=W2=70.7 nm; 5) W3=W4=30 nm; 5) W0=100 nm; 6) L0=200 nm; 7) L1=30 nm; 7) L2=50 nm; 8) $\theta/2\sim30°$; 9) $\beta\sim45°$ This prototypical NFL device 10 may exhibit a threshold gate voltage to induce the 2DEG EF $U_0\sim0.35$ V.

Figure 6:
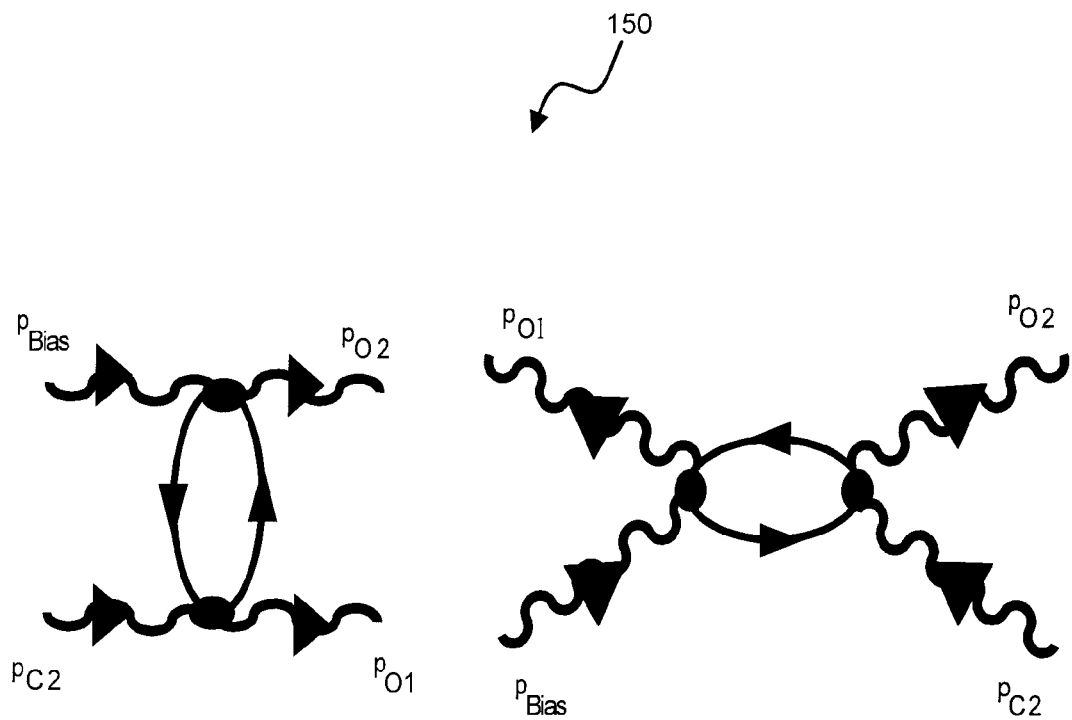
FIG. 6 is a dominant Feynman diagram for plasmon-plasmon scattering according to the present invention.

Referring to FIG. 6, dominant Feynman diagrams 150 for plasmon-plasmon scattering are illustrated. Two SPWs with momentum vectors $\vec{p}_{Bias}$, $\vec{p}_{C2}$ and masses $m_{Bias}$, $m_{C2}$ respectively are excited/launched into terminals $S_{Bias}$ and $S_{C2}$, of the geometrical parameters of the prototypical implementation 10, and propagating on the 2DEG EF, upon interacting/colliding at the junction/center of the structure 10, the SPW with momentum $\vec{p}_{Bias}$ may be scattered (diverted/steered) by the SPW with momentum $\vec{p}_{C2}$ in the direction of output SPW $\vec{p}_{O1}$. The probability that the SPW with momentum vector $\vec{k}_{Bias}$ upon exposure to the SPW with momentum vector $\vec{k}_{C2}$ to divert by a solid angle $(\theta, \phi)$ is given by $d\sigma(\theta,\phi)$ as $$d\sigma_{2\leftarrow 2} = \frac{1}{4\sqrt{(p_{Bias}\cdot P_{C2})^2 - m_{Bias}^2 m_{C2}^2}} \int_\Delta \frac{d^3 p_{\vec{k}_{O1}}}{2p_{\vec{k}_{O1}}^0 (2\pi)^3} \frac{d^3 p_{\vec{k}_{O2}}}{2p_{\vec{k}_{O2}}^0 (2\pi)^3}$$

$$\left\langle p_{\vec{k}_{O1}}, p_{\vec{k}_{O2}} | \mathcal{T} | p_{Bias}, p_{C2} \right\rangle^2 (2\pi)^4 \delta^{(4)}\left(p_{Bias} + p_{C2} - p_{\vec{k}_{O1}} - p_{\vec{k}_{O2}}\right)$$

where, $p_{Bias}$ is the SPW with momentum vector $\vec{k}_{Bias}$, $p_{C2}$ is the control SPW with momentum vector $\vec{k}_{C2}$, $p_{\vec{k}_{O2}}$ is the SPW in the direction of $\vec{k}_{O2}$, $p_{\vec{k}_{O1}}$ is the SPW in the direction of $\vec{k}_{O1}$, $\mathcal{T}$ is the plasmon-plasmon scattering amplitude, and $\Delta$ is the area/shell over which integration is performed.

Figure 7A:
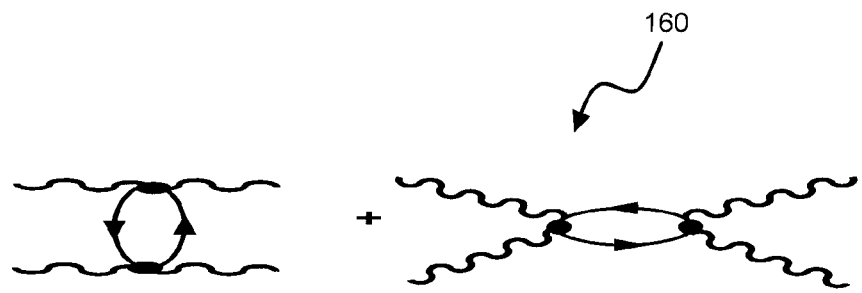
FIG. 7A through 7C illustrate a diagrammatic representation of the scattering and interacting of the at least one surface plasma wave (SPW).
Figure 7B:
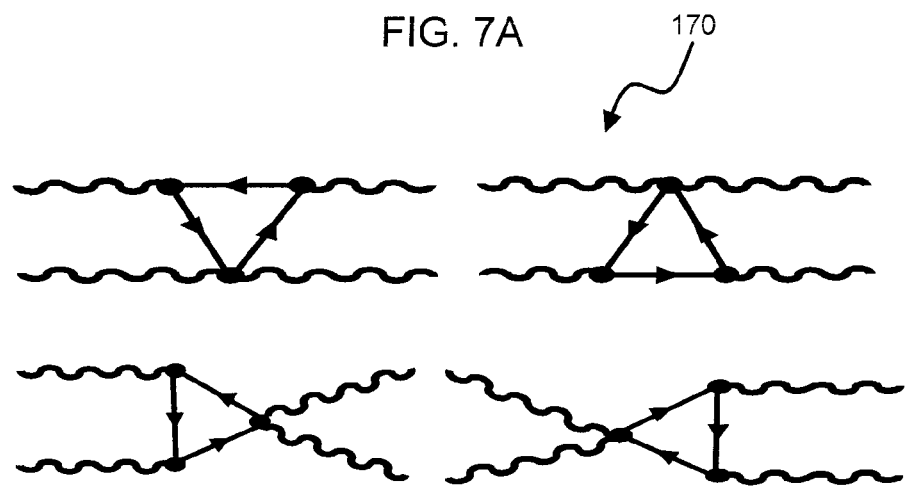
Figure 7C:
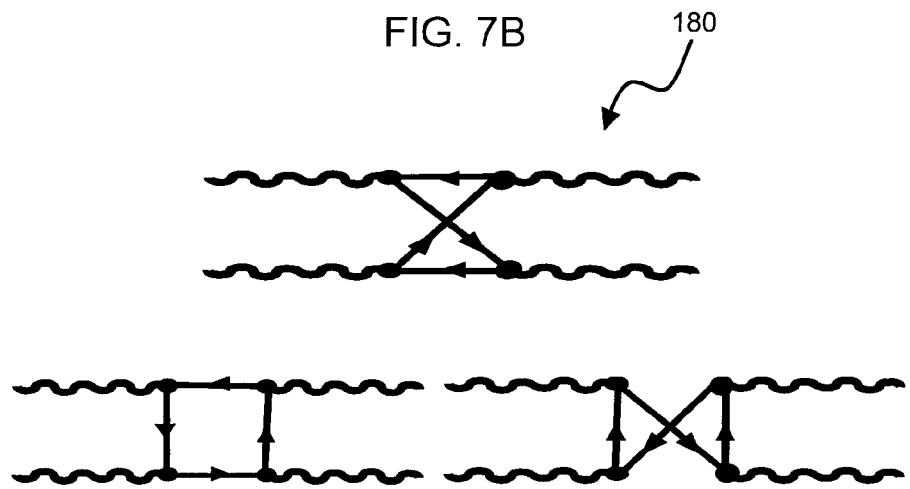

Referring to FIGS. 7A through 7C, a diagrammatic representation of the scattering and interacting of the at least one SPW is illustrated. The solid lines denote electrons ($\rightarrow$) and holes ($\leftarrow$), respectively. The dots denote the Bohm-Pines vertices for electron-plasmon interactions. The interactions between plasmons captured by kernel, $K(k_1k_2; k_3k_4)$, may be represented as bubble contributions 150, triangle contributions 160, and square contributions 170. Accordingly, the interaction between plasmons captured by the kernel may be expressed as $K=K_B+K_T+K_S$ where $K_B$ stands for terms arising from two $\gamma_4$'s (B for bubbles), $K_T$ stands for terms arising from one $\gamma_4$ and two $\gamma_3$'s (T for triangles), and $K_S$ stands for terms arising from four $\gamma_3$'s (S for square). Out of these contributions to the kernel, the triangle and square parts are negligible with respect to the bubble contributions. The essence of the bubble contribution is given by the strength of the plasmon-plasmon coupling, $g_4(Q)\cong 4\omega_0^2 K_s(Q+k, -k; Q+k', -k')$ where Q is the total momentum.

Figure 8:
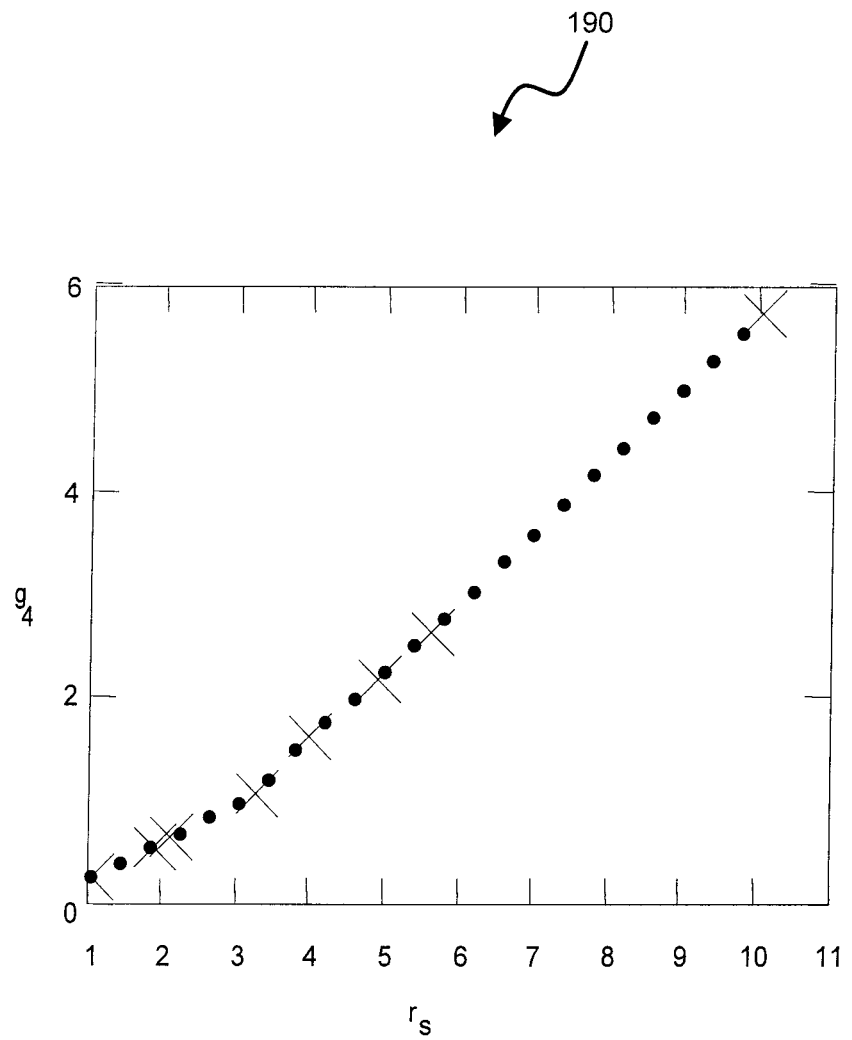
FIG. 8 is a graphical representation of plasmon-plasmon scattering strength as a function of normalized volume per conduction electron.

FIG. 8 is a graphical representation of plasmon-plasmon scattering strength as a function of normalized volume per conduction electron. Using the dispersion relation, $$g_4(Q=0, \omega=2\omega_0) = \frac{\mu k_F}{F_0^2} \frac{5\alpha r_s}{192\pi^5} \times$$

$$\int_{\substack{k'<\beta \\ p'-k'<\beta}} dp' dk' \frac{[(p'-k')\cdot k']^2}{|p'-k'|^4 k'^2} \times \left(\frac{1}{k'^2} + \frac{1}{k'^2 + 5\omega_0^2/3}\right) S_{HF}(p')$$

where, $$F_0(Q=0, \omega=2\omega_0) = (\mu k_F/\pi^2)\times\left[-\beta + \sqrt{5\omega_0^2/12}\tan^{-1}\left(\beta/\sqrt{5\omega_0^2/3}\right)\right]$$

and $$\beta = k_c/k_F \cdot S_{HF}(p')$$

denotes the Hartree-Fock structure factor and $r_s=(3/4\pi n_s)^{1/3}/a_0$. $a_0=h^2/me^2$ and $\alpha \cong 1/137$ is the fine structure constant. Using this equation, g4 may be calculated for various values of, $r_s$ from 1 to 10 as shown in FIG. 7. The sign of g4 is positive for all $r_s$, thereby the plasmon-plasmon interaction is repulsive. The SPWs interacting in the junction of the device may be steered/scattered as prescribed by momentum conservation principles.

All features disclosed in this specification, including any accompanying claims, abstract, and drawings, may be replaced by alternative features serving the same, equivalent or similar purpose, unless expressly stated otherwise. Thus, unless expressly stated otherwise, each feature disclosed is one example only of a generic series of equivalent or similar features.

Although preferred embodiments of the present invention have been shown and described, various modifications and substitutions may be made thereto without departing from the spirit and scope of the invention. Accordingly, it is to be understood that the present invention has been described by way of illustration and not limitation.

What is claimed is:

1. A nano-electron fluidic logic (NFL) device that controls propagation of at least one surface plasma wave (SPW) in a waveguiding structure, the device comprising:
   a metallic gate patterned in accordance with a plurality of geometrical parameters;
   a plurality of source terminals, the source terminals include $S_{Bias}$, $S_{C1}$, $S_{C2}$, at which the plurality of SPWs is launched; and
   a plurality of drain terminals, the drain terminals include $D_{O1}$, $D_{O2}$, at which the plurality of SPWs may be detected;
   whereby the NFL device allows the launching of a bias SPW and a control SPW at an angle to the bias SPW into the waveguiding structure, the NFL device operates by steering the propgation direction of the bias SPW resulting in NFL device speed which depends on a propagation velocity of the at least one SPW and yields femto-seconds switching speeds at femto-joules power dissipation.

2. The device of claim 1, wherein the bias SPW is excited utilizing the bias current to attain a momentum vector ($\vec{K}_{Bias}$, $\vec{K}_{O1}$, $\vec{K}_{O2}$).

3. The device of claim 1, wherein the waveguiding structure is a patterned two-dimensional electron gas (2DEG), the 2DEG being biased so as to behave as an electron fluid (EF).

4. The device of claim 3, wherein the 2DEG steers the at least one SPW with velocity about two orders of magnitude greater than that at which electrons propagate.

5. The device of claim 3, wherein the waveguiding structure causes an excitation to the at least one SPW resulting in at least one plasmon.

6. The device of claim 1, wherein the waveguiding structure may be a Luttinger liquid.

7. The device of claim 6, wherein the waveguiding structure causes an excitation to the at least one SPW resulting in at least one plasmon.

8. The device of claim 7, wherein the energy dissipated to launch the at least one plasmon in the 2DEG of total mass m is given by $E_d = mv_{sat}^2/2\omega_0\tau$,
   wherein
   $v_{sat}$ is the saturation velocity of electrons;
   $\omega_0$ is the plasma oscillation frequency; and
   $\tau$ is the effective mean time between collisions.

9. The device of claim 8, wherein the propagation velocity is given by $$S_{2D} = \sqrt{e^2 n_s d/m^* \epsilon_r \epsilon_0}$$

wherein
   $\epsilon_0 = 8.854 \times 10^{-12} A^2 s^4 kg^{-1} m^{-3}$;
   $\epsilon_r = 12.9$, the relative dielectric constant of a semiconductor;
   $m^* = 0.067 m_0$, the electron effective mass;
   $n_s = 1 \times 10^{16} m^{-2}$,
   the free carrier density; and
   $d = 3$ nm, the gate-channel separation.

10. The device of claim 1, wherein the control SPW with at least one momentum vector momentum vector ($\vec{K}_{O1}$, $\vec{K}_{C2}$) excited by at least one control current ($I_{C1}$, $I_{C2}$) causes the scattering of the bias SPW with the momentum vector wavevector ($\vec{K}_{Bias}$) excited by the bias current ($I_{Bias}$) in the direction of at least one output SPW with at least one momentum vector ($\vec{K}_{O1}$, $\vec{K}_{O2}$).

11. The device of claim 10, wherein a probability that the bias SPW with momentum vector $\vec{K}_{Bias}$ upon exposure to the control SPW with momentum vector $\vec{K}_{C2}$ to divert by a solid angle ($\theta$, $\phi$) is given by $d\sigma(\theta, \phi)$ as $$d\sigma_{2 \leftarrow 2} = \frac{1}{4\sqrt{(p_{Bias} \cdot P_{C2})^2 - m_{Bias}^2 m_{C2}^2}} \int_\Delta \frac{d^3 p_{\vec{k}_{O1}}}{2p^0_{\vec{k}_{O1}}(2\pi)^3} \frac{d^3 p_{\vec{k}_{O2}}}{2p^0_{\vec{k}_{O2}}(2\pi)^3}$$

$$\left| \left\langle p_{\vec{k}_{O1}}, p_{\vec{k}_{O2}} | \mathcal{J} | p_{Bias}, p_{C2} \right\rangle \right|^2 (2\pi)^4 \delta^{(4)}\left( p_{Bias} + p_{C2} - p_{\vec{k}_{O1}} - p_{\vec{k}_{O2}} \right)$$

wherein,
   $p_{Bias}$ is the SPW with momentum vector $\vec{K}_{Bias}$;
   $p_{C2}$ is the control SPW with momentum vector $\vec{K}_{C2}$;
   $p_{\vec{k}_{O2}}$ is the SPW in the direction of $\vec{K}_{O2}$;
   $p_{\vec{k}_{O1}}$ is the SPW in the direction of $\vec{K}_{O1}$;
   $\mathcal{J}$ is the plasmon-plasmon scattering amplitude; and
   $\Delta$ is the area/shell over which the integration is performed.

12. The device of claim 10, wherein the at least one SPW substantially diverts in a direction of at least one momentum vector ($\vec{K}_{O1}$, $\vec{K}_{O2}$) of the at least one output SPW causing an increase in at least one drain current ($I_{O1}$, $I_{O2}$) in at least one drain terminal ($D_{O1}$, $D_{O2}$).

13. The device of claim 10, wherein presence of the at least one output SPW with the at least one momentum vector ($\vec{K}_{O1}$, $\vec{K}_{O2}$) at least one drain terminal ($D_{O1}$, $D_{O2}$) is detected as a logic 1.

14. The device of claim 10, wherein absence of the at least one output SPW with the at least one momentum vector ($\vec{K}_{O1}$, $\vec{K}_{O2}$) at least one drain terminal ($D_{O1}$, $D_{O2}$) is detected as a logic 0.

15. The device of claim 1, wherein speed of the NFL device is a function of SPW propagation velocity in terahertz switching frequencies.

16. The device of claim 1, wherein dispersion relation of the at least one SPW in the presence of the at least one drain current ($I_{O1}$, $I_{O2}$) produced in the at least one drain terminal ($D_{O1}$, $D_{O2}$) is given by $k = \omega/(v_0 \pm s_{SPW})$,
   wherein
   k is the wavefactor;
   $v_0$ is the electron velocity; and
   $s_{SPW}$ is the SPW velocity.

17. The device of claim 16, wherein the plus sign pertains to propagation of the at least one SPW along the direction of the current.

18. The device of claim 16, wherein the minus sign pertains to propagation of the at least one SPW in the opposite direction of the current.

19. The device of claim 1, wherein speed of the at least one SPW generation calculated as displacement of the at least one SPW in at least one direction is given by $$\tau_{SPW\_Displacement} = \pi/\omega_0$$

wherein $\omega_0$ is the plasma oscillation frequency.

20. The device of claim 1, wherein the at least one SPW with a smallest switching time is approximately given by $$\tau_{SPW\_Displacement} + L/S_{SPW}$$

wherein

L is the source-drain distance; and $s_{SPW}$ is the SPW velocity.

21. A nano-electron fluidic logic (NFL) device that controls propagation of at least one bias surface plasma wave (bias SPW) in the absence of at least one control SPW in a wave guiding structure, the device comprising:

a metallic gate patterned in accordance with a plurality of geometrical parameters;

a plurality of source terminals, the source terminals include $S_{Bias}$, $S_{C1}$, $S_{C2}$, at which the plurality of SPWs is launched; and a plurality of drain terminals, the drain terminals include $D_{O1}$, $D_{O2}$, at which the plurality of SPWs is detected;

whereby the bias SPW splits substantially into equal portions that may be detected at at least one drain terminal ($D_{O1}$, $D_{O2}$), and whereby the device controls propagation of the at least one bias SPW by Plasmon-plasmon scattering.

22. A method for controlling the launching and propagation of at least one surface plasma wave (SPW) in a nano-electron fluidic logic (NFL) operation, the method comprising the steps of:

creating a patterned two-dimensional electron gas (2DEG) underneath at least one patterned metallic gate, the 2DEG being biased so as to behave as an electron fluid (EF);

launching the at least one bias SPW on the 2DEG fluid;

launching a control SPW at an angle to the bias SPW on the 2DEG fluid;

propagating on the 2DEG fluid by plasmon-plasmon scattering, specifically, by interacting and colliding the bias SPW and the control SPW; and detecting at least one output SPW with at least one momentum vector ($\vec{K}_{O1}$, $\vec{K}_{O2}$) in the direction of at least one drain terminal ($D_{O1}$, $D_{O2}$).

23. The method of claim 22, wherein presence of the at least one output SPW at the at least one momentum vector ($\vec{K}_{O1}$, $\vec{K}_{O2}$) at the at least one drain terminal ($D_{O1}$, $D_{O2}$) is detected as a logic 1.

24. The method of claim 22, wherein absence of the at least one output SPW with the at the at least one momentum vector ($\vec{K}_{O1}$, $\vec{K}_{O2}$) at the at least one drain terminal ($D_{O1}$, $D_{O2}$) is detected as a logic 0.

25. The device of claim 1, wherein the metallic gate includes at least one N-doped region at a plurality of source terminals and a plurality of drain terminals to serve as the source of a bias current, a drain current and a control current.

* * * * *